United States Patent [19]
Ahne et al.

[11] 4,385,165
[45] May 24, 1983

[54] POLYIMIDE, POLYISOINDOLOQUINAZOLINE DIONE, POLYOXAZINE DIONE AND POLYQUINAZOLINE DIONE PRECURSOR STAGES AND THE MANUFACTURE

[75] Inventors: Hellmut Ahne, Röttenbach; Eberhard Kühn, Hemhofen; Roland Rubner, Röttenbach, all of Fed. Rep. of Germany

[73] Assignee: Siemens Aktiengesellschaft, Berlin and Munich, Fed. Rep. of Germany

[21] Appl. No.: 179,453

[22] Filed: Aug. 19, 1980

[30] Foreign Application Priority Data

Aug. 21, 1979 [DE] Fed. Rep. of Germany ....... 2933826

[51] Int. Cl.³ .............................................. C08G 18/30
[52] U.S. Cl. .................................... 528/53; 350/96.34; 525/426; 525/450; 528/73; 528/351; 528/353; 528/74; 528/75
[58] Field of Search ..................... 528/73, 74, 75, 353, 528/53, 351; 525/426, 450; 350/96.34

[56] References Cited
U.S. PATENT DOCUMENTS 3,886,119  5/1975  D'Alelio ............................. 528/353
3,957,512  5/1976  Kleeberg et al. ..................... 528/75
4,251,419  2/1981  Heilman et al. ..................... 525/426

*Primary Examiner*—Maurice J. Welsh
*Attorney, Agent, or Firm*—Kenyon & Kenyon

[57] ABSTRACT

The present invention relates to oligomeric and/or polymeric radiation-reactive precursor stages of polyimides, polyisoindoloquinazoline diones, polyoxazine diones and polyquinazoline diones as well as to a method for the preparation of these radiation-reactive precursor stages. The invention provides addition products of olefinically unsaturated monoepoxides on carboxyl group-containing polyaddition products of aromatic and/or heterocyclic tetracarboxylic-acid dianhydrides and diamino compounds or diamino compounds with at least one ortho-position amido group, or on carboxyl group-containing polyaddition products of aromatic and/or heterocyclic dihdyroxy dicarboxylic acids or corresponding diaminodicarboxylic acids and diisocyanates. The radiation-reactive precursor stages according to the invention are suitable, for example, for the manufacture of highly heat-resistant relief structures.

13 Claims, No Drawings

POLYIMIDE, POLYISOINDOLOQUINAZOLINE DIONE, POLYOXAZINE DIONE AND POLYQUINAZOLINE DIONE PRECURSOR STAGES AND THE MANUFACTURE

BACKGROUND OF THE INVENTION

The present invention relates to oligomeric and/or polymeric, radiation-reactive precursor stages of polyimides, polyisoindoloquinazoline diones, polyoxazine diones and polyquinazoline diones as well as to a method for manufacturing these radiation-reactive precursor stages.

Precursor stages of the type mentioned, which are soluble in organic solvents, are known, for example, from German Pat. No. 2 308 830 or the corresponding U.S. Pat. No. 3,957,512. The known polymer precursor stages are polyaddition or polycondensation products of polyfunctional carbocyclic or heterocyclic compounds, carrying radiation-sensitive radicals, with diamines, diisocyanates, bis-acid chlorides and dicarboxylic acids. The compounds carrying radiation-sensitive radicals contain two carboxyl, carboxylic acid chloride, amino, isocyanate or hydroxyl groups suitable for addition or condensation reactions and, partially, in ortho- or peri-position thereto, radiation-reactive groups bound to carboxyl groups in ester-fashion, and the diamines, diisocyanates, bis-acid chlorides and dicarboxylic acids to be reacted with these compounds have at least one cyclic structure element.

Radiation-reactive polyimide precursor stages are prepared in particular in such a manner that unsaturated alcohols such as allyl alcohol are added on tetracarboxylic acid dianhydrides such as pyromellitic-acid dianhydride, the liberated carboxylic-acid groups of the diesters then formed are converted into acid chloride groups, and the diester-bis-acid-chlorides are subjected to a polycondensation reaction with a diamine (usually aromatic) such as diaminodiphenyl ether. If diamino compounds are used which have amido groups in ortho-position, polyisoindoloquinazoline diones are produced in a similar manner.

Polyoxazine dione precursor stages are produced by polyaddition of diisocyanates such as diphenylmethane diisocyanate, on phenolic hydroxyl groups of olefinically unsaturated diesters such as methylene disalicyclic-acid ester and, in a similar manner, polyquinazoline diones are prepared by polyaddition of diisocyanates on amino groups of olefinically unsaturated diesters.

The known preparation methods generally require several reaction stages and low temperatures. In addition, if acid chlorides are used, intensive purification of the reaction products is required and the synthesis of unsaturated diesters of the kind mentioned is difficult to carry out.

SUMMARY OF THE INVENTION

It is an object of the present invention to provide oligomeric and/or polymeric precursor stages of polyimides, polyisoindoloquinazoline diones, polyoxazine diones and polyquinazoline diones, which are soluble in organic solvents, are radiation-reactive and can be produced in a simple manner.

According to the invention, this and other objects are achieved by the provision that the precursors consist of addition products of olefinically unsaturated monoepoxides on (a) carboxyl group-containing polyaddition products of aromatic and/or heterocyclic tetracarboxylic-acid dianhydrides and diamino compounds (or diamino compounds with at least one ortho-position amido group) or on (b) carboxyl group-containing polyaddition products of aromatic and/or heterocyclic dihydroxy-dicarboxylic acids (or corresponding diamino-dicarboxylic acids) and diisocyanates.

Within the scope of the present application, "tetracarboxylic-acid dianhydride" is understood to describe compounds which have at least two acid anhydride groupings. The term "diamino compounds" also includes compounds which contain the structural element $>N-N<$, i.e., derivatives of hydrazine. "Diamino compounds with at least one ortho-position amido group" are understood to mean compounds which carry at least one amido group in ortho-position to one of the two amino groups.

The polyimide, polyisoindoloquinazoline dione, polyoxazine dione and polyquinazoline dione precursor stages according to the present invention can be synthesized in a simple manner. They are radiation-sensitive and can, therefore, readily be cross-linked. The cross-linked products can then be converted by thermal treatment in a simple manner into highly heat-resistant polyimides, polyisoindoloquinazoline diones, polyoxazinediones or polyquinazolinediones. These polymer precursor stages are highly soluble in organic solvents, particularly polar solvents. For economic and ecological reasons, however, it is furthermore important that the precursor stages, due to the presence of hydroxyl groups, can be processed, at least partially, in or from a partially aqueous solution.

The polymer precursor stages according to the present invention are suitable, in particular, for the preparation of structured, highly heat-resistant protection and insulating layers in microelectronics (generation of fine structures) as well as for use as a photoresist (see in this connection the concurrently-filed U.S. patent application "Method For The Preparation Of Highly Heat-Resistant Relief Structures And The Use Thereof", Ser. No. 179,454, filed Aug. 19, 1980 and now U.S. Pat. No. 4,311,785, issued Jan. 19, 1982.

The radiation-reactive precursor stages according to the present invention generally have the following structure:

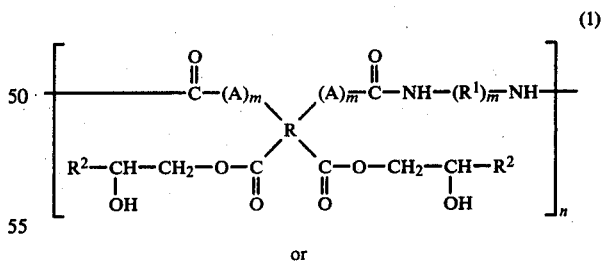

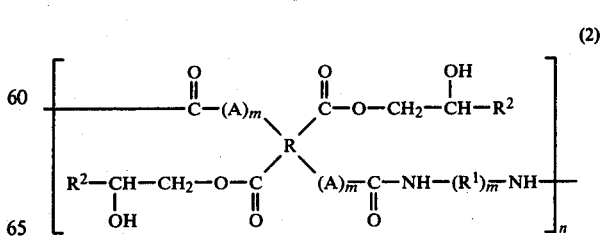

In Formulas (1) and (2), n is an integral number from 2 to about 100 and m is 0 or 1.

The following applies to R, $R^1$, $R^2$ and A:

R is an optionally halogenated, at least partially aromatic and/or heterocyclic tetravalent, i.e., tetra-functional, radical, in which two valences always are arranged adjacent to each other. If the radical R has several aromatic and/or heterocyclic structure elements, the valence pairs are always in end positions at such structure elements;

$R^1$ is an optionally halogenated divalent, i.e., difunctional, radical of aliphatic and/or cycloaliphatic structure, optionally with hetero atoms, and/or aromatic and/or heterocyclic structure;

$R^2$ is an olefinically unsaturated radical, particularly an, optionally substituted, (meth)acrylic ester-containing group; and A means —O— or —NH—.

The radicals R, $R^1$ and $R^2$ have in particular the following meaning:

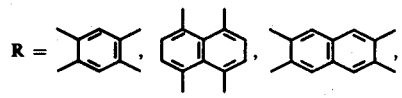

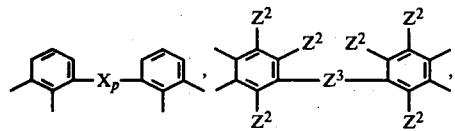

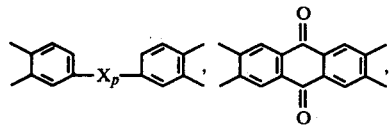

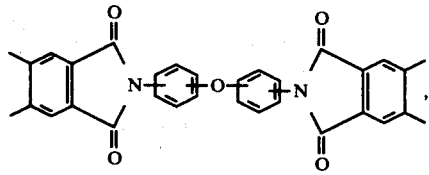

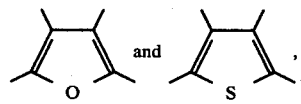

where p=0 or 1 and X stands for one of the following radicals:

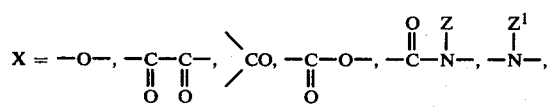

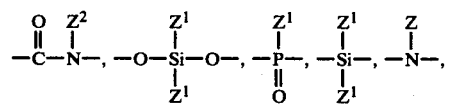

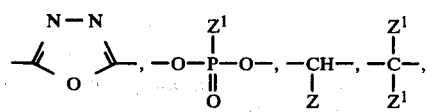

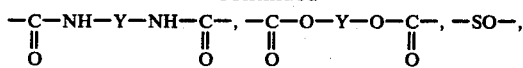

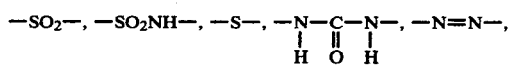

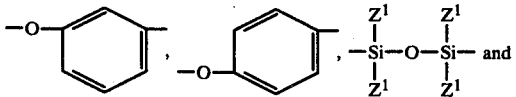

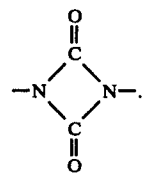

For the other radicals:

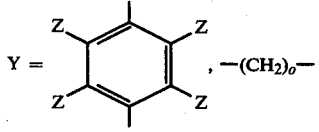

with o=2 to 10, and

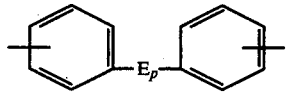

with p=0 or 1,
Z=H or alkyl with 1 to 6 carbon atoms,
$Z^1$=alkyl with 1 to 10 carbon atoms or aryl,
$Z^2$=aryl or hetero aryl, and

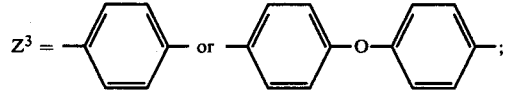

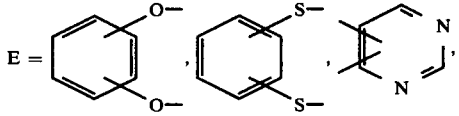

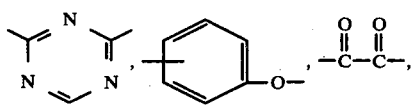

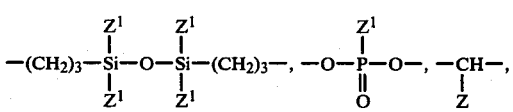

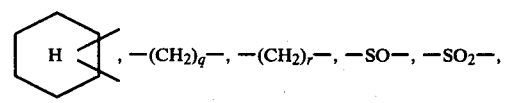

-continued
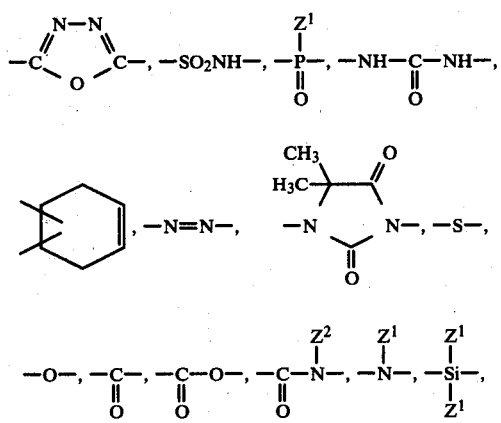
where q=2 to 14 and r=2 to 18, and $Z^1$ and $Z^2$ are as defined above.
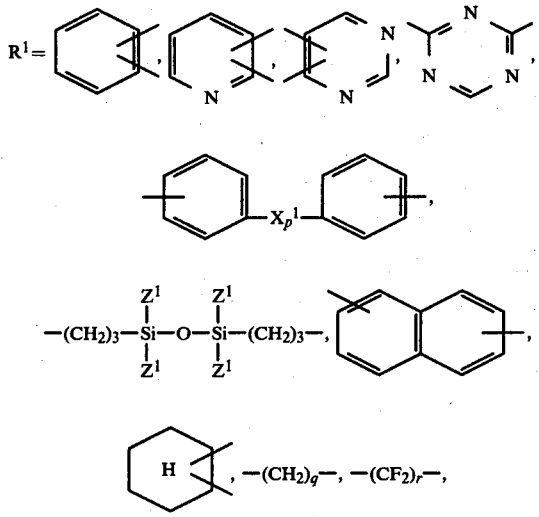
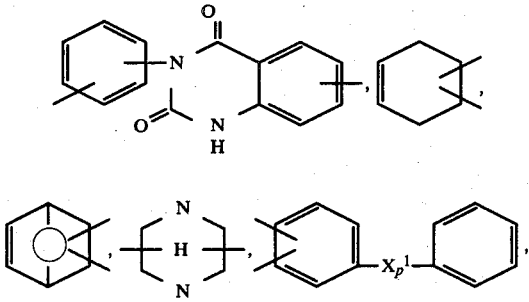
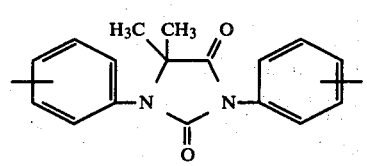
-continued
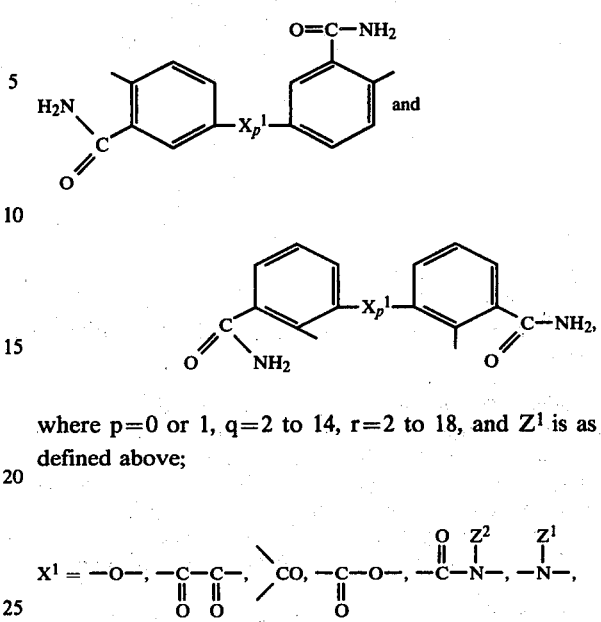
where p=0 or 1, q=2 to 14, r=2 to 18, and $Z^1$ is as defined above;
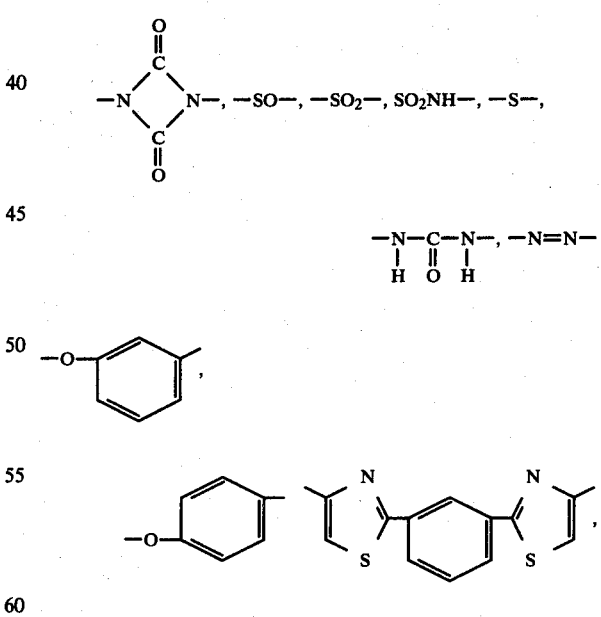
where Z, $Z^1$ and $Z^2$ are as defined above.
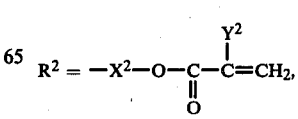

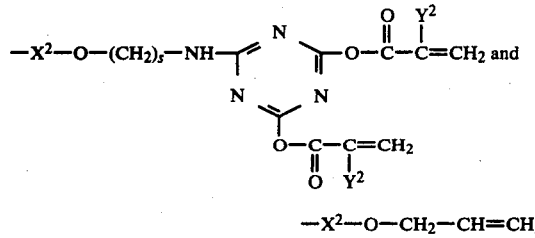

—X²—O—CH₂—CH=CH₂;

where
s = 2 to 16;
X² = —CH₂— and —CH₂—O—[(CH₂)ᵣ—O]ₜ—(CH₂)ₛ—
Y² = —H, —CH₃, —Cl, —Br or —C≡N,
where r = 2 to 18, s = 2 to 16 and t = 1 to 10.

The radiation-reactive precursor stages according to the present invention are addition products of olefinically unsaturated monoepoxides on carboxyl group-containing prepolymers. These prepolymers are:

Polyaddition products of tetracarboxylic-acid dianhydrides and diamino compounds (polyimide prepolymers);

polyaddition products of tetracarboxylic-acid dianhydrides and o-amino amides (polyisoindoloquinazoline dione prepolymers);

polyaddition products of dihydroxy-dicarboxylic-acids and diisocyanates (polyoxazine dione prepolymers); and polyaddition products of diamino-dicarboxylic-acids and diisocyanates (polyquinazoline dione prepolymers).

Preferred tetracarboxylic acid dianhydrides are the anhydride of pyromellithic acid and benzophenonetetracarboxylic acid. However, trimellithic acid anhydride of the following structure (3) may also be used:

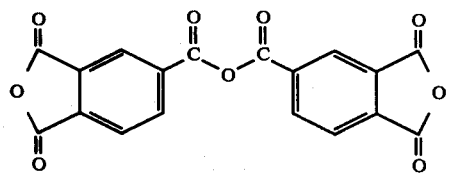

or the diester dianhydride of structure (4):

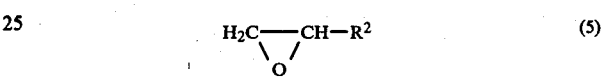

Among the diamino compounds, 4,4'-diaminodiphenyl ether is preferred, and among the o-amino amides, 4,4'-diaminodiphenyl-3,3'-dicarboxylic acid amide is preferred. As the dihydroxy dicarboxylic acid, there is preferably used 4,4'-dihydroxydiphenylmethane-3,3'-dicarboxylic acid (methylenedisalicyclic acid), and as the diamino dicarboxylic acid, 4,4'-diaminodiphenyl-3,3'-dicarboxylic acid is preferred. The preferred diisocyanate is 4,4'-diphenylmethane diisocyanate.

On the carboxyl group-containing prepolymers mentioned, olefinically unsaturated monoepoxides are added. These epoxides have the following structure (5), where the unsaturated radical R² has the meaning given above:

$$H_2C\underset{O}{\overset{}{\diagdown\diagup}}CH-R^2 \qquad (5)$$

Preferred are the unsaturated epoxides glycidyl acrylate and -methacrylate.

The structure of the radiation-reactive precursor stages according to the invention are illustrated by way of example with the aid of the following Formulas (6) and (7).

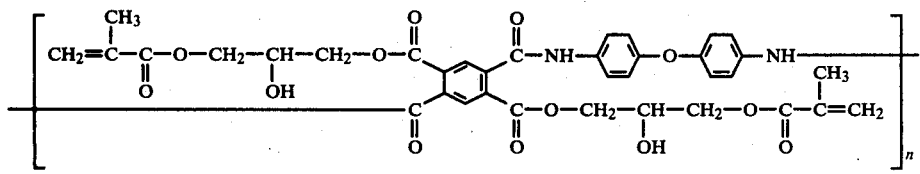

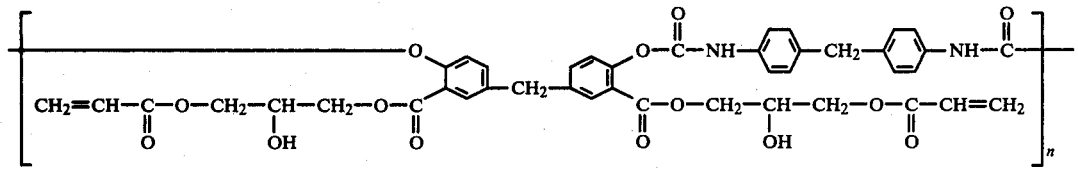

In Formula (6), a radiation-reactive polyimide precursor stage is shown, and specifically, the addition product of glycidyl methacrylate on the polyaddition product of pyromellithic-acid dianhydride and 4,4'-diaminodiphenyl ether. Formula (7) shows the addition product of glycidylacrylate on the polyaddition product of 3,3'-dicarboxyl-4,4'-dihydroxydiphenylmethane and 4,4'-diphenyl methane diisocyanate, i.e., a radiation-reactive polyoxazine dione precursor stage, and specifically a polybenzoxazine dione precursor stage.

The precursor stages according to the invention have as basic building blocks preferably aromatic carboxylic acids and thus result, in the thermal treatment, in polymers with the following structural units (8) to (11):

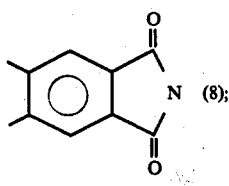

Polyimide

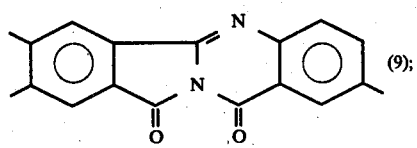

Polyisoindoloquinazoline dione

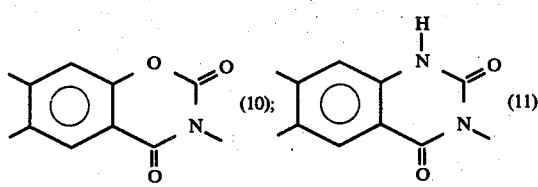

Polyoxazine dione        Polyquinazoline dione

The term "polyimides" also includes polyester imides (12) and polyamidimides (13):

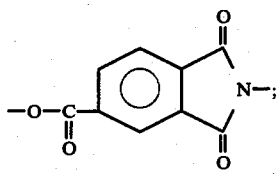

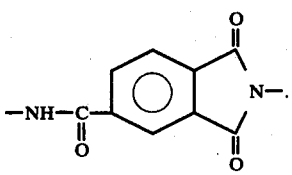

The polyimide, polyisoindoloquinazoline dione, polyoxazine dione and polyquinazoline dione precursor stages are advantageously prepared in such a manner that an aromatic and/or heterocyclic tetracarboxylic acid dianhydride is reacted with a diamino compound or a diamino compound with at least one ortho-position amido group, or an aromatic and/or heterocyclic dihydroxy dicarboxylic acid or a corresponding diamino dicarboxylic acid with a diisocyanate to form a carboxyl group-containing reaction product, and that the reaction product is brought to reaction with an olefinically unsaturated monoepoxide at room temperature or at temperatures up to about 100° C. in an organic solvent, optionally in the presence of an aminic catalyst.

As to the preparation of the compounds, this method is simple to carry out, with temperatures of about 50° to 60° C. generally being sufficient. Since no acid chlorides participate in the reaction, elaborate cooling and purification operations are not required. In addition, the reaction products are produced in pure condition.

The surprising fact that the reaction of the unsaturated monoepoxides with the carboxyl group-containing prepolymers takes place at temperatures below 100° C. is of decisive importance in the method according to the invention since, at temperatures above 100° C., the conversion of the precursor stages into insoluble, cyclization products would be expected.

In the method according to the present invention, it is advantageous to provide the tetracarboxylic acid dianhydride for the reaction with the diamino compound, i.e., in the preparation of the so-called prepolymers, in excess; the reaction product obtained; namely, a polyamido carboxylic acid, is then brought to reaction with hydroxyethyl acrylate and/or methacrylate prior to the reaction with the olefinically unsaturated monoepoxide. In this manner, the end-position acid anhydride groups are intercepted or bound, and compounds with a clearly defined structure are obtained. The solubility also can be influenced by means of the intercept reagent, and, particularly, increased sensitivity of the radiation-reactive precursor stage can be obtained due to the unsaturated nature of this component.

In addition to their use as photoresists and for the preparation of protective and insulating layers with a structure, the precursor stages according to the present invention also can serve generally in non-structured form for the preparation of protective and insulating coatings. To particular advantage, these precursor stages can be used for the preparation of plastic coatings for the optical fibers of light waveguides.

DETAILED DESCRIPTION OF THE INVENTION

The invention is explained in further detail with the aid of the following, non-limiting embodiment examples.

EXAMPLE I

Preparation of a Radiation-Reactive Polyimide Precursor Stage

To 65.4 parts by weight pyromellithic-acid dianhydride (0.3 mol) in 450 parts by volume dimethylacetamide are added, while stirring, 45 parts by weight 4,4'-diamino diphenyl ether (0.23 mol) and subsequently, stirring is continued for two hours at room temperature. Two parts by weight methacrylic-acid-2-hydroxyethyl ester (0.016 mol) then are aded to the reaction mixture in order to bind the still present end-position anhydride groups. After stirring for 2 hours at room temperature, 150 parts by volume glycidyl methacrylate, 1.5 parts by weight benzyl dimethylamine and 0.1 parts by weight hydroquinone are added to the reaction solution. Subsequently, the solution is warmed up while being stirred for 23 hours to a temperature of about 50° to 60° C. and is then added dropwise to 4000 parts by volume ethanol while being stirred vigorously. The precipitate so formed is drawn off and dried at room temperature in a vacuum. The reaction product is no longer soluble in an aqueous alkaline solution, but is soluble in polar organic solvents. In the IR spectrum, the polyimide precursor stage shows an ester band at 5.8 μm.

EXAMPLE II

Preparation of a Radiation-Reactive Polyamidimide Precursor Stage 50 parts by weight of a polyamidimide prepolymer prepared from 2,6-diamino pyridine and trimellithic-acid anhydride are dissolved in 200 parts by volume dimethylacetamide and reacted, while stirring, with 0.05 parts by weight benzyldimethylamine, 0.05 parts by weight hydroquinone and 75 parts by volume glycidyl methacrylate. Thereupon, the solution is warmed for 19 hours to a temperature of 50° to 60° C. and the resin is subsequently precipitated from 3000 parts by volume ethanol in the form of a yellow-brown powder. The IR spectrum (film) shows an ester band at 1720 cm$^{-1}$(5.8 μm); the absorption bands of the methacrylate group are at 950 and 1290 cm$^{-1}$.

EXAMPLE III

Preparation of a Radiation-Reactive Polyquinazoline Dionimide Precursor Stage From 22 parts by weight pyromellithic-acid dianhydride, dissolved in 200 parts by volume dimethylacetamide, and 27 parts by weight 3-(p-aminophenyl)-7-amino-2,4-(1H, 3H)-quinazoline dione, dissolved in 150 parts by volume dimethylacetamide, a polyquinazoline dionimide prepolymer is obtained after a reaction time of 2 hours at room temperature while stirring.

To the solution of this prepolymer in dimethylacetamide are added 2 parts by volume acrylic acid-2-hydroxy-ethyl ester. After stirring for one hour, 50 parts by volume glycidylacrylate, 0.5 parts by weight benzyldimethylamine and 0.05 parts by weight hydroquinone are added to the reaction solution. After heating to a temperature of about 60° C. for 20 hours, the solution is added dropwise to 3000 parts by volume methanol while stirring vigorously. The resin precipitated in the process is drawn off, washed with methanol and dried at room temperature in a vacuum. The resin is insoluble in an aqueous alkaline solution and shows an ester band at 5.8 μm in the IR spectrum.

EXAMPLE IV

Preparation of a Radiation-Reactive Polyisoindoloquinazoline Dione Precursor Stage 11 parts by weight 4,4 -diaminodiphenyl-3,3'-dicarboxylic-acid amide are suspended in 120 parts by volume dimethylacetamide and reacted, while stirring, with 10 parts by weight pyromellithic-acid dianhydride, dissolved in 100 parts by volume of a dimethylacetamide/dimethylformamide mixture (volume ratio 1:1). After stirring for 2 hours, 25 parts by volume glycidyl methacrylate, 0.5 parts by weight benzyldimethylamine and 0.05 parts by weight hydroquinone-monoethyl ether are added to the solution obtained. After stirring for 25 hours at a temperature of 60° C., a resin is precipitated from the solution with 3000 parts by volume propanol, and is dried. This resin is no longer soluble in aqueous alkaline solutions and shows an ester band at 5.8 μm in the IR spectrum.

EXAMPLE V

Preparation of a Radiation-Reactive Polybenzoxazine Dione Precursor Stage

To a solution of 28.8 parts by weight methylene disalicyclic acid (0.1 mol) and 0.1 parts by weight 1,4-diazabicyclo [2.2.2] octane as catalyst in 100 parts by volume N-methylpyrrolidone, 25 parts by weight p,p'-diphenylmethane diisocyanate (0.1 mol), dissolved in 50 parts by volume N-methylpyrrolidone, are slowly added dropwise at room temperature while stirring. After a reaction time of 20 hours at room temperature, 75 parts by volume glycidyl acrylate and 0.1 parts by weight hydroquinone are added to this solution while stirring. After a further reaction time of 20 hours at a temperature of 50° to 60° C. and 48 hours at room temperature, the resin is precipitated with 2000 parts by volume toluene and dried in a vacuum.

5 parts by weight of the dried resin are dissolved in 20 parts by volume of a dimethylacetamide/dioxane mixture (volume ratio 1:1), are centrifuged on an aluminum foil to form a film and are exposed for 2 minutes with a 500-W very-high pressure mercury lamp. The resin layer so obtained in insoluble in a dimethylacetamide/dioxane mixture.

EXAMPLE VI

Preparation of a Radiation-Reactive Polyquinazoline Dione Precursor Stage 1.4 parts by weight 4,4'-diphenylmethane diisocyanate are dissolved in 110 parts by weight polyphosphoric acid at about 100° C. and then heated to about 140° C. 1:36 parts by weight 4,4'-diamino-3,3'-diphenyl dicarboxylic acid are added to the so obtained solution in nitrogen. The reaction mixture is vigorously stirred for 5 hours at a temperature of 150° to 155° C., precipitated after cooling with 1000 parts by volume water, and the yellow-brown product (2.7 parts by weight) obtained thereby is dried. The non-radiation-reactive prepolymer, a polyurea acid, shows in the IR spectrum an absorption at 1670 cm$^{-1}$, which is typical of the urea grouping. However, no quinazoline dione bands appear, which should be at about 1730 cm$^{-1}$, i.e., no partial cyclizing has yet taken place.

2.7 parts by weight of the polyurea acid obtained in the manner described are dissolved in 50 parts by volume N-methylpyrrolidone, and added to it are 0.5 parts by weight benzyldimethylamine, 0.5 parts by weight hydroquinone and 20 parts by volume glycidyl methacrylate while stirring, and heated for 20 hours to a temperature of about 60° C. The solution obtained thereby is added dropwise to 500 parts by volume propanol and the resin precipitated in the process is dried. The resulting yellow-brown powder is no longer soluble in a 1-% aqueous-alkaline solution. The IR spectrum shows methacrylate absorption bands at 950 and 1290 cm$^{-1}$ and an ester band at 1720 cm$^{-1}$.

What is claimed is:

1. An oligomeric and/or polymeric radiation-reactive precursor stage of polyimides, polyisoindoloquinazoline diones, polyoxazine diones and polyquinazoline diones, comprising an addition product of an olefinically unsaturated monoepoxide on a product selected from the group consisting of:
   (a) a carboxyl-group-containing polyaddition product of an aromatic and/or heterocyclic tetracarboxylic acid dianhydride and a compound selected from the group consisting of a diamino compound and a diamino compound having at least one ortho-position amido group; and
   (b) a carboxyl-group-containing polyaddition product of (1) a compound selected from the group consisting of an aromatic and/or heterocyclic dihydroxy dicarboxylic acid and a corresponding diamino dicarboxylic acid, and (2) a diisocyanate.

2. The radiation-reactive precursor stage according to claim 1, wherein said unsaturated monoepoxide comprises a member selected from glycidyl acrylate and glycidyl methacrylate.

3. The radiation-reactive precursor stage according to claim 1 wherein said tetracarboxylic-acid dianhydride comprises the anhydride of a member selected from pyromellithic acid and benzophenone tetracarboxylic acid.

4. The radiation-reactive precursor stage according to claim 1 wherein said diamino compound comprises a member selected from 4,4'-diaminodiphenyl ether and 4,4'-diaminodiphenyl-3,3'-dicarboxylic acid amide.

5. The radiation-reactive precursor stage according to claim 1 wherein said dihydroxy dicarboxylic acid comprises 4,4'-dihydroxydiphenylmethane-3,3'-dicarboxylic acid.

6. The radiation-reactive precursor stage according to claim 1 wherein said diamino dicarboxylic acid comprises 4,4'-diaminophenyl-3,3'-dicarboxylic acid.

7. The radiation-reactive precursor stage according to claim 1 wherein said diisocyanate comprises 4,4'-diphenylmethane diisocyanate.

8. A method for the preparation of radiation-reactive precursor stages comprising reacting an aromatic and/or heterocyclic tetracarboxylic acid dianhydride with a member selected from the group consisting of a diamino compound and a diamino compound having at least one ortho-position amido group to form a carboxyl-group-containing reaction product; and reacting said reaction product with an olefinically unsaturated monoepoxide at a temperature from about room temperature to about 100° C. in an organic solvent.

9. A method for the preparation of radiation-reactive precursor stages, comprising reacting a member selected from the group consisting of an aromatic and/or heterocyclic dihydroxy dicarboxylic acid and a corresponding diamino dicarboxylic acid with a diisocyanate to form a carboxyl-group-containing reaction product; and reacting said reaction product with an olefinically unsaturated monoepoxide at a temperature from about room temperature to about 100° C. in an organic solvent.

10. The method according to claim 8 wherein the reaction of said reaction product with said monoepoxide is conducted in the presence of an aminic catalyst.

11. The method according to claim 9 wherein the reaction of said reaction product with said monoepoxide is conducted in the presence of an aminic catalyst.

12. The method according to claim 8 wherein said tetracarboxylic-acid dianhydride is used in excess in the reaction with said diamino compound, and the reaction product obtained is brought to reaction with hydroxyethyl-acrylate and/or -methacrylate prior to the reaction with said monoepoxide.

13. A plastic coating for the optical fibers of a light waveguide comprised of the polymer precursor stage of claim 1.

* * * * *